United States Patent
Nakatani et al.

(10) Patent No.: US 7,930,974 B2
(45) Date of Patent: Apr. 26, 2011

(54) SCREEN PRINTING MACHINE AND SOLAR CELL

(75) Inventors: Mitsunori Nakatani, Tokyo (JP); Toshihiko Fujihara, Tokyo (JP); Yuichiro Hosokawa, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 586 days.

(21) Appl. No.: 11/920,411

(22) PCT Filed: Jun. 27, 2006

(86) PCT No.: PCT/JP2006/312828
§ 371 (c)(1),
(2), (4) Date: Nov. 15, 2007

(87) PCT Pub. No.: WO2008/001430
PCT Pub. Date: Jan. 3, 2008

(65) Prior Publication Data
US 2009/0314336 A1    Dec. 24, 2009

(51) Int. Cl.
*B41L 13/00*    (2006.01)
(52) U.S. Cl. .......................... 101/126; 101/129; 101/474
(58) Field of Classification Search .................. 101/126
See application file for complete search history.

(56) References Cited

U.S. PATENT DOCUMENTS

| | | | |
|---|---|---|---|
| 4,068,994 A | 1/1978 | Cadwallader et al. | |
| 4,667,417 A | 5/1987 | Graser et al. | |
| 4,747,211 A * | 5/1988 | Gilleo et al. | 101/126 |
| 5,323,701 A * | 6/1994 | Sommer | 101/126 |
| 5,759,669 A | 6/1998 | Casey et al. | |
| 5,927,193 A * | 7/1999 | Balz et al. | 101/129 |
| 6,069,065 A | 5/2000 | Arimoto et al. | |
| 6,598,292 B1 * | 7/2003 | Segawa et al. | 101/126 |
| 6,745,687 B1 * | 6/2004 | Kaminar | 101/129 |
| 2002/0192485 A1 | 12/2002 | Ochi et al. | |

FOREIGN PATENT DOCUMENTS

| | | |
|---|---|---|
| JP | 61-46237 A | 3/1986 |
| JP | 61-144898 A | 7/1986 |
| JP | 4-199895 A | 7/1992 |
| JP | 07-030256 | 1/1995 |
| JP | 09-156072 A | 6/1997 |
| JP | 10-335267 A | 12/1998 |
| JP | 11-5294 A | 1/1999 |
| JP | 2000-255028 A | 9/2000 |

(Continued)

OTHER PUBLICATIONS

Supplementary European Search Report issued in corresponding Application No. 06767445.7-1251 dated Sep. 30, 2009.

(Continued)

*Primary Examiner* — Jill E Culler
(74) *Attorney, Agent, or Firm* — Buchanan Ingersoll & Rooney PC

(57) ABSTRACT

A printing stage includes a stage surface having a plurality of suction holes, and fixes an object to be printed on the stage surface by vacuum contact. A printing mask is employed for forming a predetermined electrode pattern on the object to be printed fixed to the printing stage. A squeegee applies a predetermined amount of pressure to a metal paste spread on the printing mask, to print the electrode pattern on the object to be printed. A porous body is provided between the object to be printed and the printing stage.

8 Claims, 6 Drawing Sheets

FOREIGN PATENT DOCUMENTS

| | | |
|---|---|---|
| JP | 2001-293842 A | 10/2001 |
| JP | 2001-315302 A | 11/2001 |
| JP | 2002-151813 A | 5/2002 |
| JP | 2004-090137 A | 3/2004 |
| WO | WO 00/21347 | 4/2000 |

OTHER PUBLICATIONS

PCT/ISA/210, Jun. 27, 2006.
PCT/ISA/237, Jun. 27, 2006.

* cited by examiner

SCREEN PRINTING MACHINE AND SOLAR CELL

TECHNICAL FIELD

The present invention relates to a screen printing machine and a solar cell produced by the screen printing machine.

BACKGROUND ART

A screen printing method is used to produce electrodes in a solar cell and a display unit such as a liquid crystal display, a plasma display, and an organic electro luminescence (EL) display. In the screen printing method, a printing mask formed with a predetermined pattern thereon is used. The printing mask is placed at a predetermined distance from an object to be printed placed on a printing stage, and paste including an electrode material is supplied on the printing mask. The paste is spread on the printing mask by a squeegee, and only the paste on a meshed area is applied to the object to be printed. The paste applied to the object to be printed is baked at a predetermined temperature depending on the electrode material, and thereby the electrode is formed.

The printing stage used for the screen printing includes a stage surface and a vacuum conduit. The stage surface is formed with a plurality of suction holes and the object to be printed is placed on the stage surface. The vacuum conduit communicates with the suction holes, and is formed within a main body of the printing stage below the stage surface. The printing stage aligns and fixes the object to be printed by vacuum contact the object to be printed with the stage surface that includes the suction holes using a vacuum line connected to the vacuum conduit.

To form the electrode on a substrate of the solar cell by the screen printing method, the object to be printed is placed immediately on the stage surface that includes the suction holes. When the solar cell cracks during a printing process, debris of the solar cell or a printing paste clot is sucked from the suction hole of the printing stage into the suction hole and the vacuum conduit. After natural drying, the vacuum state is forcibly terminated by blowing air into the suction holes to remove the substrate before placing another substrate on the printing stage. At this time, the paste clot or the debris of the cell pops out of the suction hole and gets between the stage surface and the substrate to damage the substrate of the solar cell to be printed on.

Patent document 1 discloses a technology of providing a sponge as a cushion below a printed circuit board (PCB) to be printed on so that solder paste is evenly printed on the PCB and parts on the PCB are not damaged.

Patent document 1: Japanese Patent Laid-open No. H04-199895

DISCLOSURE OF INVENTION

Problem to be Solved by the Invention

However, while the sponge is provided under the object to be printed according to the patent document 1, the sponge provided between the printing stage including a plurality of suction holes and a solar cell to be printed on occludes the suction holes and prevents the vacuum contact. For this reason, the technology disclosed in the patent document 1 cannot be applied to the screen printing machine that includes the printing stage using the vacuum contact.

The present invention was made in view of the problems described above, and it is an object of the present invention to provide a screen printing machine and a solar cell, with a capability of preventing the object to be printed from being damaged by such a foreign particle as debris or a paste clot and improving a production yield.

Means for Solving Problem

To solve the above problems and to achieve the object, a screen printing machine according to one aspect of the present invention includes a printing stage that includes a stage surface having a plurality of suction holes, and fixes an object to be printed on the stage surface by vacuum contact; a printing mask for forming a predetermined electrode pattern on the object to be printed fixed to the printing stage; and a squeegee that applies a predetermined amount of pressure to a metal paste spread on the printing mask, to print the electrode pattern on the object to be printed. A porous body is provided between the object to be printed and the printing stage.

EFFECT OF THE INVENTION

According to an aspect of the present invention, a porous body mediated between the object to be printed and the printing stage covers the suction holes while vacuum contact the object to be printed, thereby prevents foreign particles from entering into the printing stage, and reliably prevents the foreign particles from popping out of the printing stage to get between the printing stage and the object to be printed and damaging the printing obstacle during serial printing operation. As a result, the production yield is improved. Moreover, there is no need to change the conventional production process, and therefore good products are produced with low cost.

BRIEF DESCRIPTION OF DRAWINGS

FIG. 4-1 is a cross-sectional view for explaining a method of producing the solar cell (Part 1);

FIG. 4-2 is a cross-sectional view for explaining a method of producing the solar cell (Part 2);

FIG. 4-3 is a cross-sectional view for explaining a method of producing the solar cell (Part 3);

FIG. 4-4 is a cross-sectional view for explaining a method of producing the solar cell (Part 4);

FIG. 4-5 is a cross-sectional view for explaining a method of producing the solar cell (Part 5);

FIG. 4-6 is a cross-sectional view for explaining a method of producing the solar cell (Part 6);

FIG. 4-7 is a cross-sectional view for explaining a method of producing the solar cell (Part 7);

FIG. 5-1 is a plan view of an example of a printing mask pattern for forming a rear aluminum electrode;

FIG. 5-2 is a plan view of an example of a printing mask pattern for forming a rear silver electrode;

FIG. 5-3 is a plan view of an example of a printing mask pattern for forming a front-surface silver electrode;

FIG. 6 is a cross-sectional view of a screen printing machine according to an embodiment of the present invention;

FIG. 7 is a cross-sectional view of a conventional screen printing machine; and

EXPLANATIONS OF LETTERS OR NUMERALS

Figure 1:
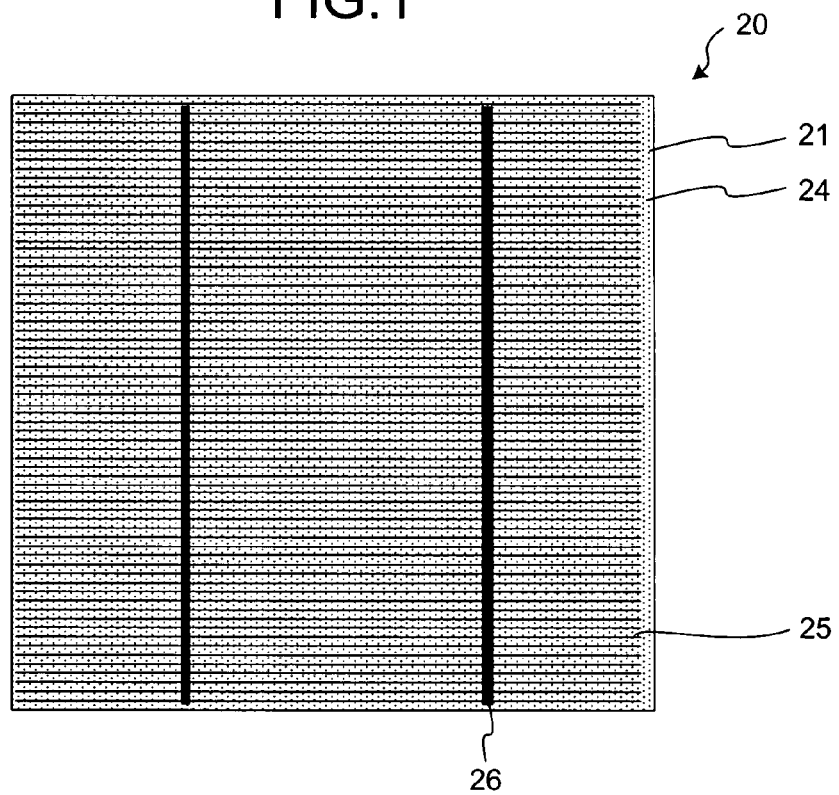
FIG. 1 is a top view of a solar cell that includes electrodes produced by a screen printing machine according to the present invention.

1 Printing stage
2 Suction hole
3 Stage surface
4 Printing mask
4a Opening
4b Masking
5 Vacuum conduit
5a Vacuum line
6 Porous film (porous body)
7 Holding plate
8 Clamp
9 Fixing tape
20 Object to be printed (solar cell)
21 Semiconductor substrate
22 p-type silicon substrate
23, 23a n-type diffusion layer
24 Antireflection coating
25 Front silver grid electrode
25a Front silver grid electrode pattern
26 Front silver bus electrode
26a Front silver bus electrode pattern
27 Rear aluminum electrode
27a Rear aluminum electrode pattern
28 Rear silver electrode (silver paste)
28a Rear silver electrode pattern
29 p+ layer
31 Printing mask frame
33 Squeegee
51 Paste clot
53 Substrate debris
61 Crack

BEST MODE(S) FOR CARRYING OUT THE INVENTION

Exemplary embodiments of a screen printing machine and a solar cell according to the present invention will be explained below in detail with reference to the accompanying drawings. The present invention is not limited to the embodiment explained below.

Before explaining a configuration of the screen printing machine according to the present invention, a configuration and a production process of the solar cell are explained.

Figure 2:
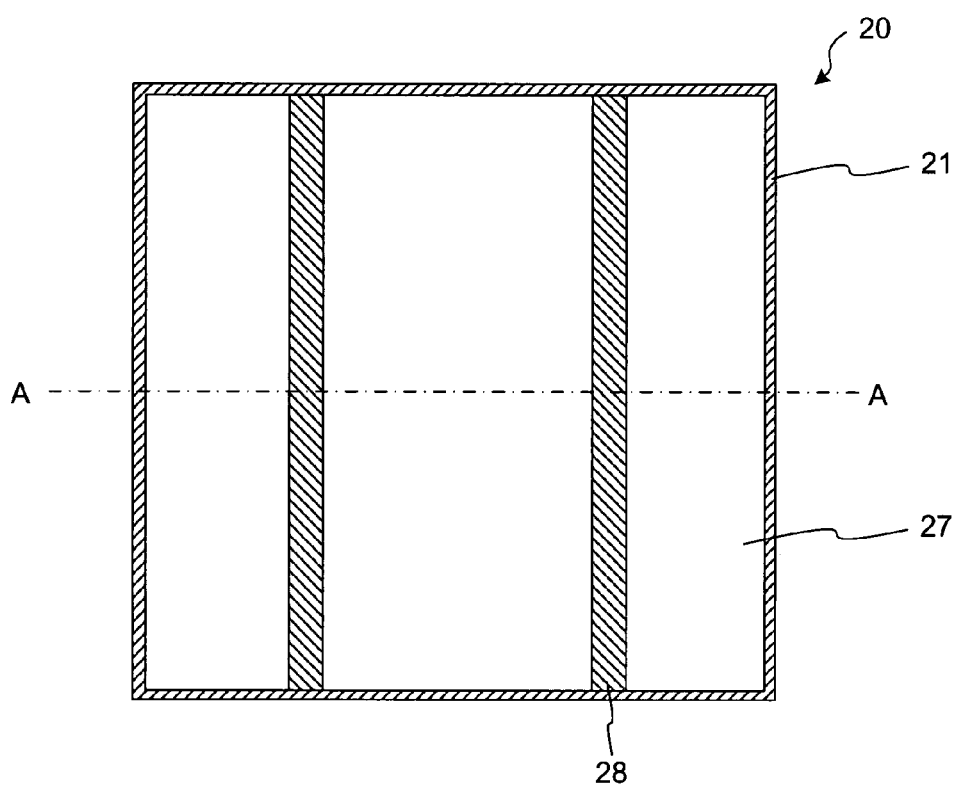
FIG. 2 is a bottom view of the solar cell shown in FIG. 1.
Figure 3:
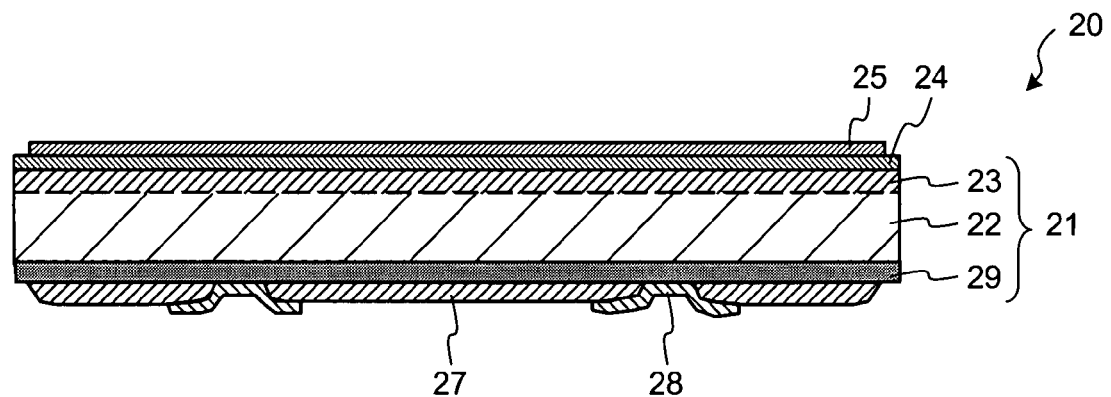
FIG. 3 is a cross-sectional view of the solar cell along the line A-A.

A configuration of a silicon solar cell is explained referring to FIGS. 1, 2, and 3. FIG. 1 is a top view of the solar cell, FIG. 2 is a bottom view of the solar cell, and FIG. 3 is a cross-sectional view of the solar cell along the line A-A. A solar cell 20 includes, as shown in FIGS. 1, 2, and 3, a p-type silicon substrate 22 as a semiconductor substrate, an n-type diffusion layer 23 in which the conductivity type on the surface is inverted from the p-type silicon substrate 22, a p+ layer 29 including heavy impurity, a semiconductor substrate 21 capable of photoelectric conversion and including the p-type silicon substrate 22, the n-type diffusion layer 23, and the p+ layer 29, an antireflection coating 24 that is provided on a photosensitive surface of the semiconductor substrate 21 and prevents reflection of an incident light, a front silver grid electrode 25 provided on the photosensitive surface to locally collect electricity generated by the semiconductor substrate 21, a front silver bus electrode 26 substantially orthogonal to the front silver grid electrode 25 to extract the electricity collected by the front silver grid electrode 25, a rear aluminum electrode 27 that substantially covers a back surface of the semiconductor substrate 21 to extract the electricity generated by the semiconductor substrate 21 and reflect the incident light, and a rear silver electrode 28 that collects the electricity generated in the rear aluminum electrode 27.

In the solar cell 20 configured as above, when a sun light irradiates a p-n interface (an interface between a p-type silicon substrate and an n-type silicon substrate) from the photosensitive surface of the solar cell 20, holes and electrons are generated. Due to the electric field at the p-n interface, the generated electrons move toward the n-type diffusion layer 23, and the holes move toward the p+ layer 29. When excessive electrons enter the n-type diffusion layer 23 and excessive holes enter the p+ layer 29, photovoltaic power is generated. The photovoltaic power flows to forward bias the p-n junction. This makes the front silver bus electrode 26 connected to the n-type diffusion layer 23 a negative pole and the rear silver electrode 28 connected to the p+ layer 29 a positive pole, and current flows through a circuit outside the solar cell (not shown).

Figures 1, 4:
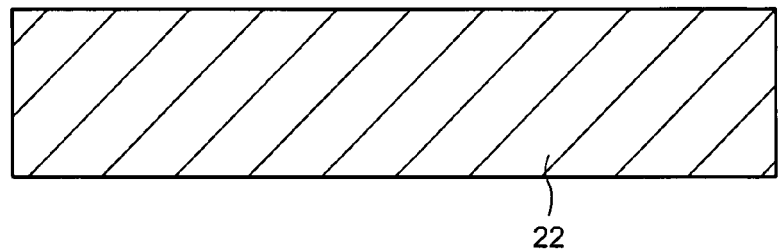
Figures 2, 4:
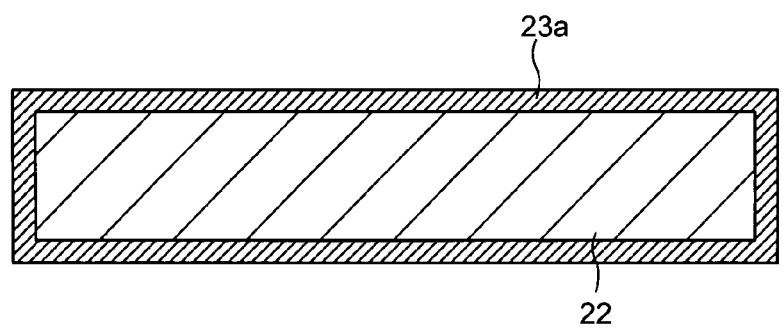
Figures 3, 4:
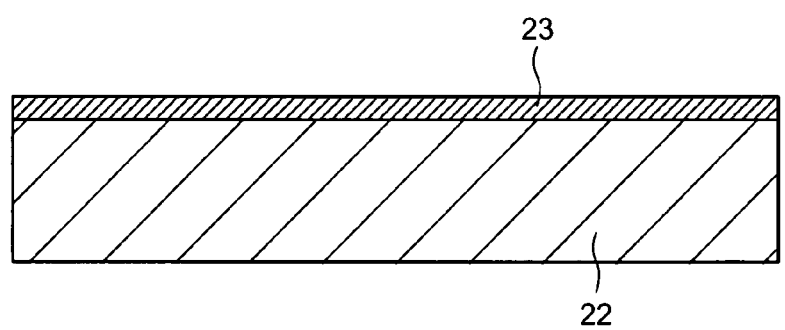
Figure 4:
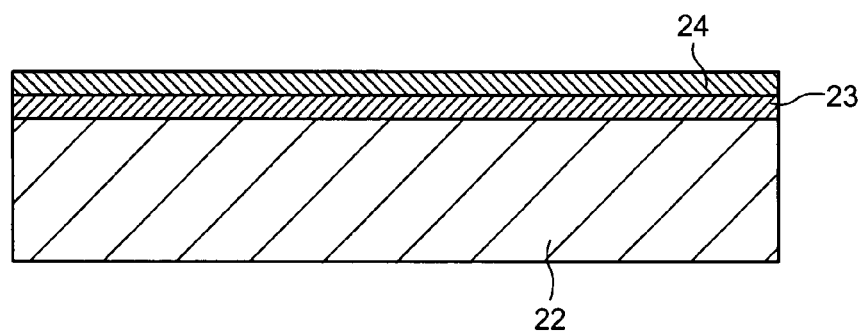

An example of a method of producing the solar cell 20 is explained according to FIGS. 4-1 to 5-3. As shown in FIG. 4-1, the p-type silicon substrate 22 that has been surface-finished (cleaned, roughened and the like on the surface) is prepared. Then, as shown in FIG. 4-2, an n-type diffusion layer 23a with the conductivity type inverted by thermally diffusing phosphorus is formed on the surface of the p-type silicon substrate 22. Generally, phosphorus oxychloride (POC13) is used as a diffusion source of the phosphorus.

After protecting a main surface of the p-type silicon substrate 22 with photoresist, as shown in FIG. 4-3, the surface of the p-type silicon substrate 22 is etched by laser and the like so that the n-type diffusion layer 23 remains only on the main surface, and the photoresist is removed using organic solvent or the like. After that, as shown in FIG. 4-4, the antireflection coating 24 consisting silicon oxide, silicon nitride, titanic oxide, or the like is formed on the surface of the n-type diffusion layer 23 with an even thickness by a film formation method such as chemical vapor deposition (CVD).

Figures 4, 5:
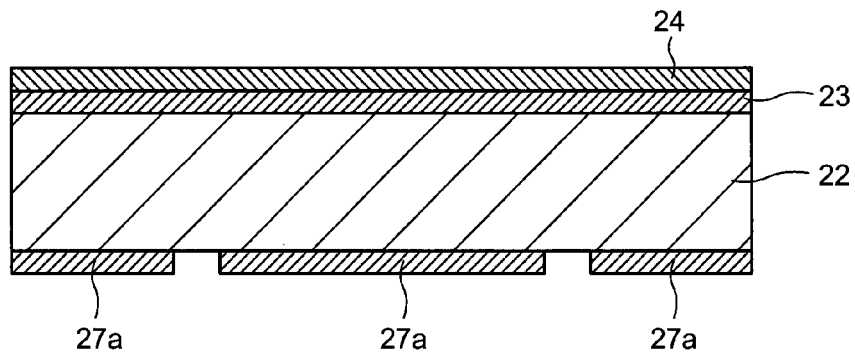
Figures 4, 5, 6:
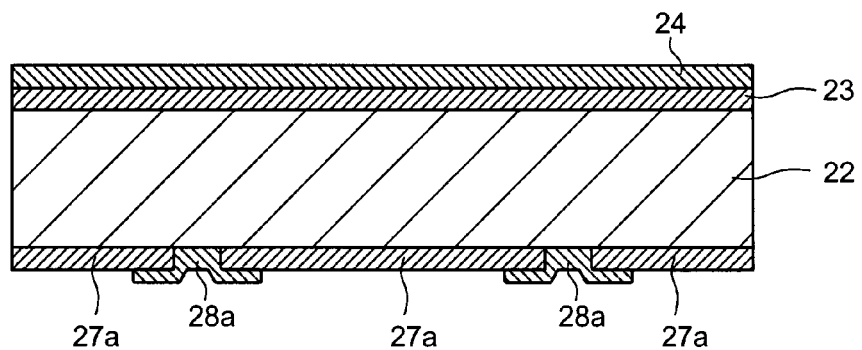

As shown in FIG. 4-5, a rear aluminum electrode pattern 27a is formed on the back surface of the p-type silicon substrate 22 by screen printing. At this time, aluminum paste is applied onto the back surface of the p-type silicon substrate 22 using a printing mask 4 shown in FIG. 5-1. The printing mask 4 includes an opening 4a corresponding to a position of an electrode pattern that is not covered by resin, and a masking 4b covered by the resin. The electrode is formed corresponding to the pattern shape of the opening 4a. After drying the rear aluminum electrode pattern 27a, as shown in FIG. 4-6, a rear silver electrode pattern 28a is further formed on the back surface by the screen printing. At this time, the silver paste is applied to the p-type silicon substrate 22 formed with the rear aluminum electrode pattern 27a using the printing mask 4 shown in FIG. 5-2 to form a pattern corresponding to the opening 4a.

After drying the rear silver electrode pattern 28a, the p-type silicon substrate 22 is turned upside down, the silver paste is applied to the antireflection coating 24 as shown in FIG. 4-7 by the screen printing, and the silver paste is dried. At this time, the silver paste is applied to the antireflection coating 24 using the printing mask 4 shown in FIG. 5-3. As a result, a front silver grid electrode pattern 25a and a front silver bus electrode pattern 26a are selectively formed on the antireflection coating 24.

The electrode patterns on the front surface and the back surface including the front silver grid electrode pattern 25a, the front silver bus electrode pattern 26a, the rear aluminum electrode pattern 27a, and the rear silver electrode pattern 28a are baked at 700 to 900 degree Celsius for a few minutes at the same time. Because of the baking, while the antireflection coating 24 is melting due to glass material in the silver paste that forms the front silver grid electrode pattern 25a and the front silver bus electrode pattern 26a on the front surface of the p-type silicon substrate 22, silver material in the silver paste contacts silicon in the n-type diffusion layer 23 on top of the p-type silicon substrate 22 and coagulates again. This ensures electrical continuity between the front silver electrodes (the front silver grid electrode 25 and the front silver bus electrode 26) and the n-type diffusion layer 23 that includes silicon. Moreover, due to the baking, the rear aluminum electrode 27 is formed, and the rear aluminum electrode pattern 27a reacts with silicon in the p-type silicon substrate 22 to form the p+ layer 29 between the p-type silicon substrate 22 and the rear aluminum electrode 27. As a result, the front silver grid electrode 25, the front silver bus electrode 26, the rear aluminum electrode 27, and the rear silver electrode 28 are formed, and the solar cell 20 configured as shown in FIGS. 1, 2, and 3 is produced.

A configuration of a screen printing machine according to the present invention is explained referring to FIG. 6. FIG. 6 indicates a state of the screen printing machine when it is forming the rear silver electrode pattern 28a shown in FIG. 4-6. The screen printing machine includes a printing stage 1, the printing mask 4, a porous film 6, a holding plate 7, a clamp 8, a printing mask frame 31, and a squeegee 33.

The printing stage 1 includes a stage surface 3 formed with a plurality of suction holes 2 to fix the solar cell 20 to be printed on, and a vacuum conduit 5 formed in a main body below the stage surface 3 in communication with the suction holes 2. The vacuum conduit 5 is connected to a vacuum pump (not shown) via a vacuum line 5a. On the printing stage 1, the solar cell 20 is aligned and fixed by vacuum contact the solar cell 20 placed on the stage surface 3 via the suction holes 2, the vacuum conduit 5, and the like.

On the solar cell 20 fixed on the printing stage 1, the printing mask 4 stretched in the printing mask frame 31 is placed at a predetermined distance from the solar cell 20 as aligned thereto. The silver paste to form the rear silver electrode 28 is thinly spread over a surface of the printing mask 4 that faces the squeegee 33. By the squeegee 33 applying a predetermined amount of pressure to the printing mask 4 and sliding in an arrowed direction in the figure, the silver paste 28 is pushed out toward the solar cell 20 through the opening 4a of the printing mask 4, and a desired electrode pattern is printed.

The screen printing machine includes the porous film (porous body) 6 such as paper or polymer film between the stage surface 3 of the printing stage 1 and the solar cell 20 to vacuum-adsorb the solar cell 20 to be printed on. As a fixing means to fix the porous film 6 to the printing stage 1, the holding plate 7 that holds an edge of the porous film 6 and the clamp 8 that fixes the holding plate 7 to the printing stage 1 are provided.

As described above, because the screen printing machine includes the porous film 6 on the printing stage 1, suction of debris of the paste or the cell into the suction hole 2 can be prevented while vacuum contact the solar cell 20 to be printed. As a result, if the semiconductor substrate 21 of the solar cell 20 cracks or the paste smears the printing stage 1 during printing, the debris does not enter the vacuum line system of the printing stage 1. No foreign particle blows out of the vacuum line system when air is forced in to release the vacuum condition after vacuum contact the semiconductor substrate 21 and printing on it for serial printing, and therefore no such foreign particle is present on the printing stage 1 and the semiconductor substrate 21 does not crack during printing.

The result of considering various materials as the porous film 6 is described below. A criterion for using the material as the porous film 6 is that the semiconductor substrate 21 does not move during printing, and it is confirmed that the material can be used if the vacuum pressure is at least 30 kilopascals at the stage when at least 60 kilopascal of vacuum pressure is supplied. Commercially available Japanese calligraphy paper, plain paper, clean paper, rice paper, and drawing paper were tested for use as a material of the porous film 6, and the result showed that all of them can be used except the drawing paper. Printing was performed without problem with the paper thickness no less than 0.01 millimeter and no more than 1 millimeter. As an example of the polymer film porous body, Sun Map, an ultra high-molecular-weight polyethylene porous film from Nitto Denko Corporation, was tested and printing was successful with the sheet thickness no less than 0.1 millimeter and no more than 2 millimeters. By using the porous film 6 made of such a material, the ratio of crack in the cell during the production of the solar cell has reduced by 0.2%.

Figures 4, 5, 6, 7:
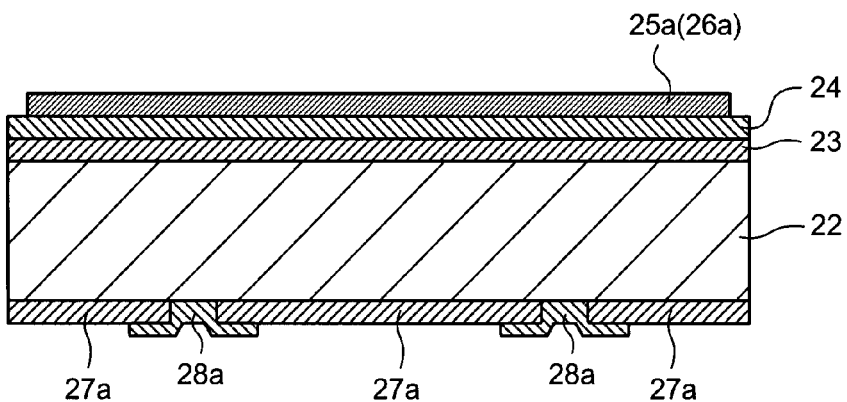
Figures 1, 5:
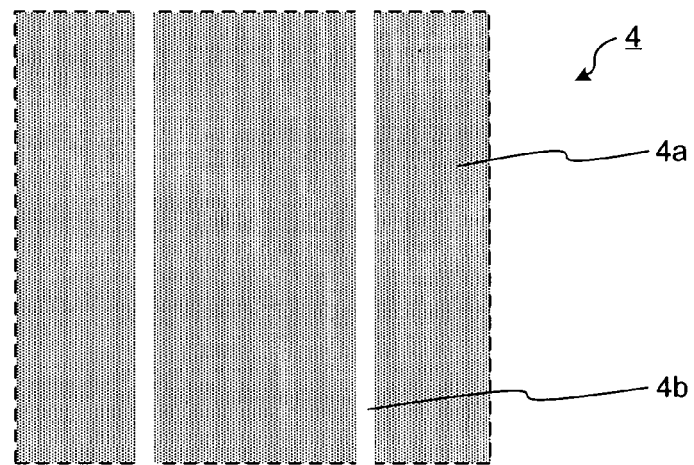
Figures 2, 5:
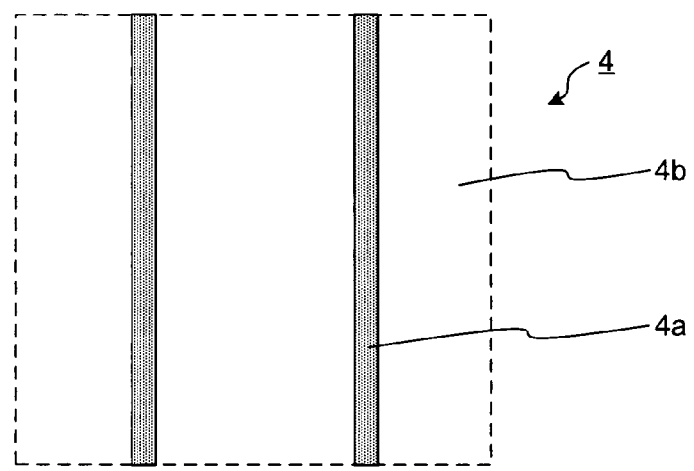
Figures 3, 5:
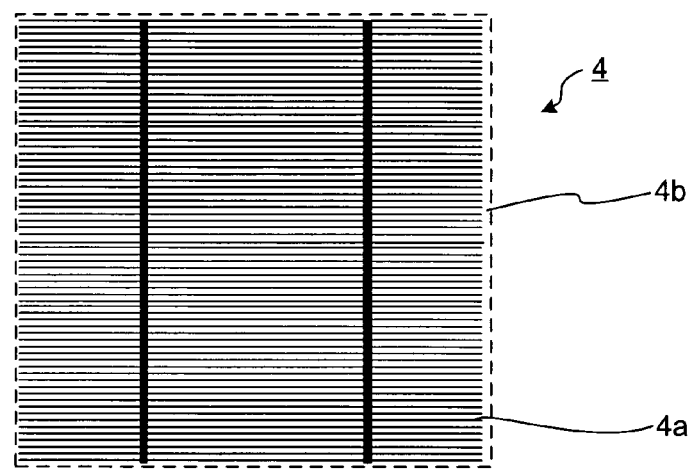
Figure 6:
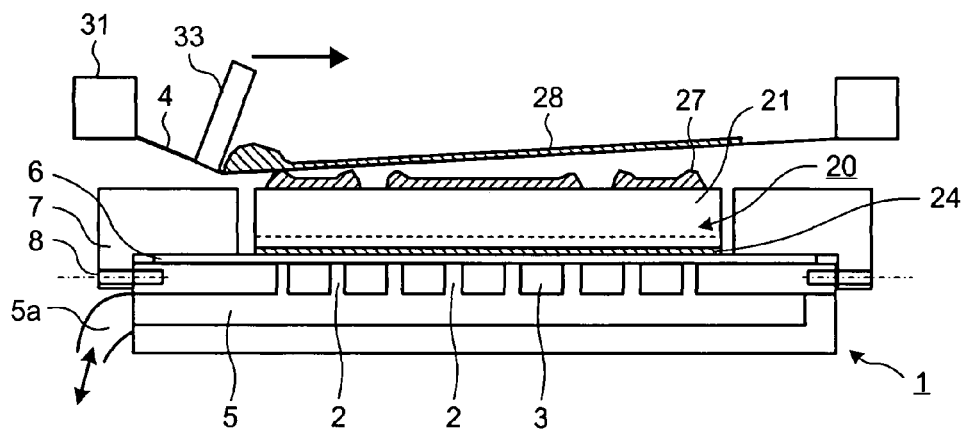
Figure 7:
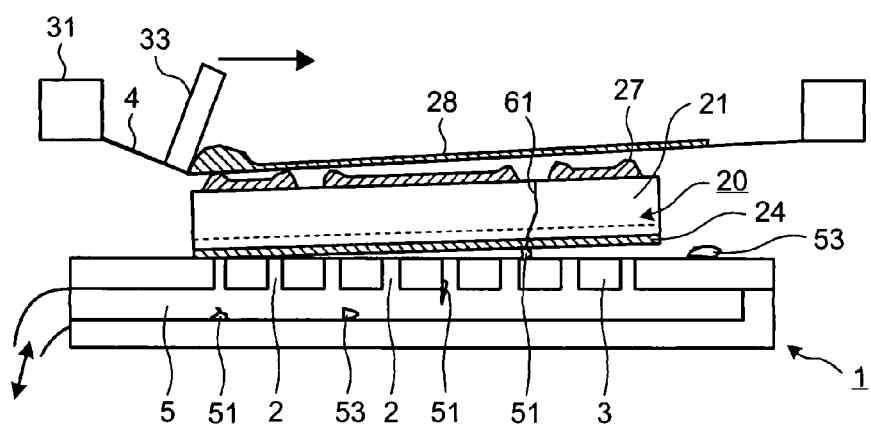

A configuration of a conventional screen printing machine in which the semiconductor substrate 21 of the solar cell 20 is placed immediately on the printing stage 1 without the porous film 6 is shown in FIG. 7. In the case, the substrate can crack because a paste clot 51 and a substrate debris 53 enter the suction holes 2 and the vacuum conduit 5 in the vacuum line system, the paste clot 51 and the substrate debris 53 pass through the suction holes 2 at the times of vacuum contact and releasing the vacuum condition and get on top of the printing stage 1, or the surface of the printing stage 1 is scratched when the semiconductor substrate 21 cracks and produces metal dust (not shown) from the stage on the surface of the printing stage 1.

While the holding plate 7 and the top surface of the semiconductor substrate 21 are at the same level in the configuration shown in FIG. 6, if the difference of the height between the two is within 0.2 millimeter, such problems can be reduced that the paste 28 does not reach the semiconductor substrate 21 to fail printing even if the squeegee 33 is pressed down, that the squeegee 33 strikes against the semiconductor substrate 21 to break the printing mask 4, and that the squeegee 33 cracks an edge of the semiconductor substrate 21.

Among a type of the printing machines that perform overlay printing by precisely aligning the semiconductor substrate 21, there is a printing machine that includes a charge-coupled device (CCD) camera or a photosensor in the printing stage 1 to sense a shadow of an edge of the shadow of the semiconductor substrate 21. Such type of the printing machine can use a transparent material as the porous film 6 so that the light can penetrate the porous film 6 and the photosensor can operate.

Figure 8:
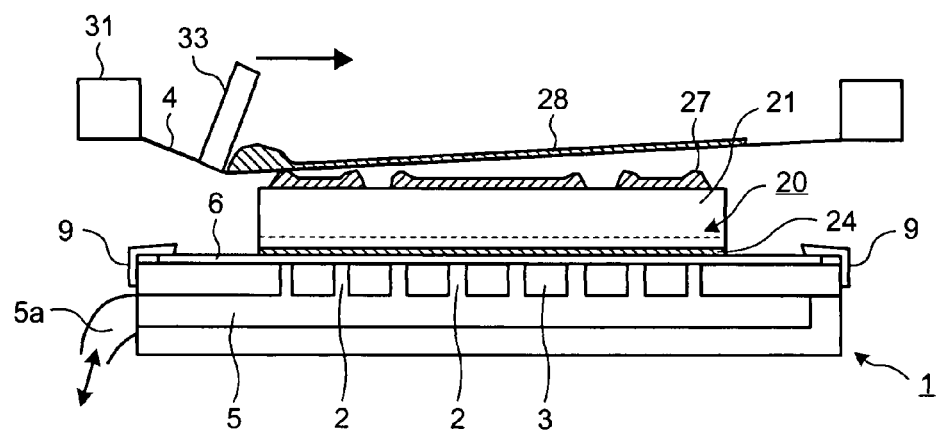
FIG. 8 is a cross-sectional view of a screen printing machine according to another embodiment of the present invention.

A configuration shown in FIG. 8 includes a fixing tape 9 instead of the holding plate 7 and the clamp 8 that fix the porous film 6 to the printing stage 1 in the printing machine shown in FIG. 6, and the fixing tape 9 supports and fixes the edge of the porous film 6. The configuration is simple, and the porous film 6 can be easily supported.

INDUSTRIAL APPLICABILITY

As described above, the screen printing machine according to the present invention is useful for the screen printing machine that prints an electrode pattern on an object to be printed such as the solar cell.

The invention claimed is:

1. A screen printing machine comprising:
   a printing stage that includes a stage surface having a plurality of suction holes, and fixes an object to be printed on the stage surface by vacuum contact;
   a printing mask for forming a predetermined electrode pattern on the object to be printed fixed to the printing stage;
   a squeegee that applies a predetermined amount of pressure to a metal paste spread on the printing mask, to print the electrode pattern on the object to be printed;
   a porous body provided between the object to be printed and the printing stage; and
   a fixing unit that holds an edge of the porous body against the surface of the printing stage to thereby prevent foreign particles from escaping out of the suction holes.

2. The screen printing machine according to claim 1, wherein the porous body is a paper.

3. The screen printing machine according to claim 2, wherein the paper is any one of Japanese writing paper, plain paper, clean paper, Japanese paper.

4. The screen printing machine according to claim 2, wherein a thickness of the paper is equal to or more than 0.01 millimeter and equal to or less than 1.00 millimeter.

5. The screen printing machine according to claim 1, wherein the porous body is a polymer.

6. The screen printing machine according to claim 5, wherein the porous body is transparent.

7. The screen printing machine according to claim 1, wherein a difference between height of the fixing unit and height of top surface of the object to be printed is within 0.2 millimeter.

8. The screen printing machine according to claim 1, wherein the vacuum contact includes at least 30 kilopascals of vacuum pressure.

* * * * *